United States Patent [19]

Hayashi

[11] Patent Number: 5,567,167

[45] Date of Patent: Oct. 22, 1996

[54] PRINTED WIRING BOARD CONNECTION APPARATUS

[75] Inventor: Akihiko Hayashi, Kawasaki, Japan

[73] Assignee: Mac Eight Co., Ltd., Yokohama, Japan

[21] Appl. No.: 354,229

[22] Filed: Dec. 12, 1994

[30] Foreign Application Priority Data

Dec. 14, 1993 [JP] Japan .................. 5-072201 U
Sep. 14, 1994 [JP] Japan .................. 6-247342

[51] Int. Cl.$^6$ .................................................. H01R 9/09
[52] U.S. Cl. .............................. 439/75; 439/82; 439/65
[58] Field of Search ...................... 439/74–75, 78–83, 439/66

[56] References Cited

U.S. PATENT DOCUMENTS

| | | | |
|---|---|---|---|
| 3,899,231 | 8/1975 | Bray | 439/80 |
| 4,130,328 | 12/1978 | Wessel | 439/75 |
| 5,186,634 | 2/1993 | Thompson | 439/83 |
| 5,215,471 | 6/1993 | Reymond et al. | 439/66 |

OTHER PUBLICATIONS

Catalogue "Mac Eight 1993", entitled Printed Wiring Board Terminals and Accessaries, published by Mac Eight Co., Ltd., Oct. 1993.

IBM Publication, Plated Through–Hole Contact by H. C. Schick, vol 6, No. 10, Mar. 1964.

*Primary Examiner*—P. Austin Bradley
*Assistant Examiner*—Jill DeMello
*Attorney, Agent, or Firm*—Armstrong, Westerman, Hattori, McLeland & Naughton

[57] ABSTRACT

A new printed wiring board connection apparatus is provided. The apparatus comprises a spacer made of synthetic resin insulation material with pin support spaces bored within it, connection pins of elastic wire each having at least one bent portion with an end thereof being bent outwardly are inserted into the pin support spaces of the spacer such that they are resiliently secured therewithin with the aid of pin engagement holes formed in the pin support spaces which receive the bent ends of the connection pins while the bent portions and opposite ends thereto of the connection pins protrude from the spacer. The aforesaid apparatus is used to connect two printed wiring boards in such a way that protruding portions of the connection pins are inserted into throughholes of the printed wiring boards. Although protruding portions are soldered except for the bent portions of the connection pins, the connection pins may be disengaged from one or both of the two printed wiring boards to provide repairing work facility.

13 Claims, 12 Drawing Sheets

5,567,167

PRINTED WIRING BOARD CONNECTION APPARATUS

BACKGROUND OF THE INVENTION

The present invention relates to a connection aparatus to connect two printed wiring boards and more particularly to a connection apparatus to electrically connect the patterns on two printed wiring boards by merely inserting the same into throughholes formed in said printed wiring boards.

In a conventional electronic device which has a complicated circuitry, it is so difficult to incorporate such circuitry into a single printed wiring board that the circuitry is actually incorporated into two boards including a main printed wiring board and a sub printed wiring board before the sub printed wiring board is piled on the main printed wiring board. In order to connect the patterns on such main and sub printed wiring boards, a connection device as shown in FIGS. 18 and 19 was employed.

FIG. 18 shows a main printed wiring board A and a sub printed wiring board B, in each of which throughholes are formed for electrically connecting said two boards. The figure also shows a connection device C including a spacer C1 of synthetic resin and connecting pins C2 planted therethrough.

In order to connect the main printed wiring board A and the sub printed wiring board B by use of this connection device as shown in FIG. 18, the upper portions of the connecting pins C2 protruding from the top side of the spacer C1 is inserted into the throughholes in the main printed wiring board A to solder said upper portions to the pattern on the top side thereof while the lower portions of the connecting pins C2 of the spacer C1 protruding from the underside of the spacer is inserted into the throughholes in the sub wiring board B to solder said lower portions to the pattern on the underside thereof.

By contrast, the connection device D shown in FIG. 19 includes a male pin assembly D1 of a similar structure to the above connection device C and a socket assembly D2. The upper portions of the male pin assembly D1 are soldered on the top side of the main printed wiring board A while the lower portions of the male pin assembly D1 are disengageably engaged in said socket assembly D2 having an underside, from which connection pins protrude to be soldered at the under-side of the sub printed wiring board B.

In the prior art as shown in FIG. 18, the structure is simple though it is extremely difficult, once connected, to disconnect the printed wiring boards A and B for repair purposes. On the other hand, the prior art shown in FIG.19 has an advantage that the work of disconnecting the two printed wiring boards A and B is easily done. However, the above two prior art devices has a common characteristic that both the connection pins C2 of the connetion devise C and the connection pins of the male pin assembly D1 as well as the connection pins of the socket D2 are soldered to the respective printed wiring boards.

For this reason, soldering is inevitably required for connection work with respect to the two printed boards A as well as B with the result that manufacturing steps are increased to incur enhanced costs while making the work of disconnecting the connection devices C and D from the related printed wiring boards more troublesome.

Further, although the prior art connection devices C and D used to connect the printed wiring boards A and B is capable of doing the connection in the vertical direction while having the aforementioned problem, it is impossible to connect the sub printed wiring board B to the main printed wiring board A in a perpendicular arrangement thereof.

SUMMARY OF THE INVENTION

The present invention is aimed at solving the above mentioned problems and has an object to provide a printed wiring board connection devise which is capable of connecting the patterns on two printed wiring boards by merely inserting connection pins resiliently into throughholes in the printed wiring boards. The present invention has another object to provide a printed wiring board connection device which is also capable of connecting the patterns on both the main and sub printed wiring boards in perpendicular relation to each other without involving soldering work.

In order to solve the above mentioned problems, the printed wiring board connection devise of the present invention comprises a spacer of synthetic resin insulation material bored with an elongated vertical space and an elongated horizontal holes formed in communication with said vertical space to open in a side face of said spacer; and a connection pin of elastic metal wire having a bent section resiliently bent in a hair pin configuration with a stopper formed by being bent outwardly at an end portion thereof, said connection pin being inserted into said vertical space within the spacer with said bent section protruding therefrom and the stopper being inserted into said horizontal hole. A required number of spacers each similar to the aforesaid spacer may be integrally formed to provide a required number of vertical spacers into each of which connection pins each similar to aforesaid one may be inserted.

The present invention also provides a printed wiring board connection apparatus comprising a spacer of synthetic resin material having elongated vertical spaces bored in said spacer, engagement holes communicating from said vertical spaces to a side surface of said spacer, and grooves formed at the lower portion of another side surface of said spaces; and first connection pins of elastic wire having bent portions resiliently bent over in a hair pin configuration, stoppers formed at respective end portions of said bent portions by bending outwardly such that said stoppers are inserted into said engagement holes at opposite sides of said spacers, and vertical portions extending from respective opposite portions of said bent portions and inserted through said vertical spaces; and second connection pins of elastic wire having bent portions resiliently bent over in a hair pin configuration, stoppers formed at respective end portions of said bent portions by bending outwardly such that said stoppers are inserted into said engagement holes of said spacers, and a horizontal portion formed by bending said pins at another opposite end portions rearwardly and inserted into said grooves to protrude rearwardly.

The present invention also provides a printed wiring board connection apparatus comprising a spacer of synthetic resin material having elongated horizontal spaces bored therethrough spaces extending forwardly and rearwardly, engagement holes communicating from top surface thereof with said horizontal spaces and grooves formed at the lower portions extending rearwardly to communicated with said horizontal spaces; and first connection pins of elastic wire having bent portions resiliently bent over in a hair pin configuration, stoppers formed at respective end portions of said bent portions by bending outwardly such that said stoppers are inserted into said engagement holes, and vertical portions formed by bending the other end portions of said bent portions; second connection pins having bent portions resiliently bent over in hair pin configuration, stoppers being formed by having one end of each bent portion outwardly to be inserted into the relevant engagement hole in the spacer, a horizontal portion formed by bending downwardly the other end portions of said bend portions to extend rearwardly along the floor surface of said spacer such that said horizontal portion protrude rearwardly after being inserted into said grooves.

The present invention further provides a printed wiring board connection apparatus comprising a spacer of synthetic resin material having elongated horizontal spaces bored therein to extend forwardly and rearwardly, engagement holes communicating with said horizontal spaces from a top surface thereof, grooves formed rearwardly from said horizontal spaces in the lower portion thereof, bent portions resiliently bent over in a hair pin configuration, stoppers formed by bending one end portions of said bent portions outwardly to be inserted into said engagement holes in the spacer, and vertical portions formed by bending the other end of said bent portions downwardly to be inserted into said grooves.

Since the printed wiring board connection devise of the present invention is contructed as aforementioned, the patterns on the two printed wiring boards are electrically connected as a result of good contact established between the connection pins and the throughholes by the resiliency of the bent portions of the connection pins protruding from the top side and the underside of the spacer.

Also spacers may be constructed continuously in an integral form so that all of or a desired number of connection pins may be inserted thereinto to connect desired patterns on the printed wiring boards are simultaneously connected.

In the other aspect of the present invention as explained in the foregoing, the patterns on the two upper and lower printed wiring boards are electrically connected by inserting into the throughholes in one of the printed wiring boards the first connection pins protruding downwardly from the underside of the spacer at opposite sides thereof where soldering thereof is done, by soldering to the patterns on said printed wiring boards the horizontal portions of the second connection pins protruding rearwardly from the lower portion of the spacer at other than the opposite sides thereof, and by inserting into throughholes in the other printed wiring board the bent portions of the first and second connection pins protruding from the top of said spacer.

In the further aspect of the present invention, the pattens on the two printed wiring boards which are arranged in perpendicular directions to each other are electrically connected by inserting the vertical portions of the first connection pins protruding from the underside of the spacer at the opposite sides thereof into the throughholes in one of the printed wiring boards where soldering thereof is done, by soldering to the patterns on said printed wiring board the horizontal portions of the second connection pins protruding backwardly from the lower portion of the spacer at other than said opposite sides thereof, and by inserting the bent portions of the first and second connection pins protruding forwardly into the throughholes of the other printed wiring board.

In still further aspect of the present invention, the patterns on the two printed wiring boards arranged in perpendicular directions to each other are electrically connected by inserting into the throughholes of one of the printed wiring boards the vertical portions of the connection pins protruding downwardly from the underside of the spacer where soldering thereof is done, and inserting into the throughholes of the other printed wiring board the bent portions of the connection pins protruding forwardly from the front face of the spacer.

BRIEF DESCRIPTION OF THE DRAWINGS

FIG. 8 is a vertical sectional side view of one of the opposite ends of the embodiment shown in FIG. 7;

DESCRIPTION OF PREFERRED EMBODIMENTS

Figure 1:
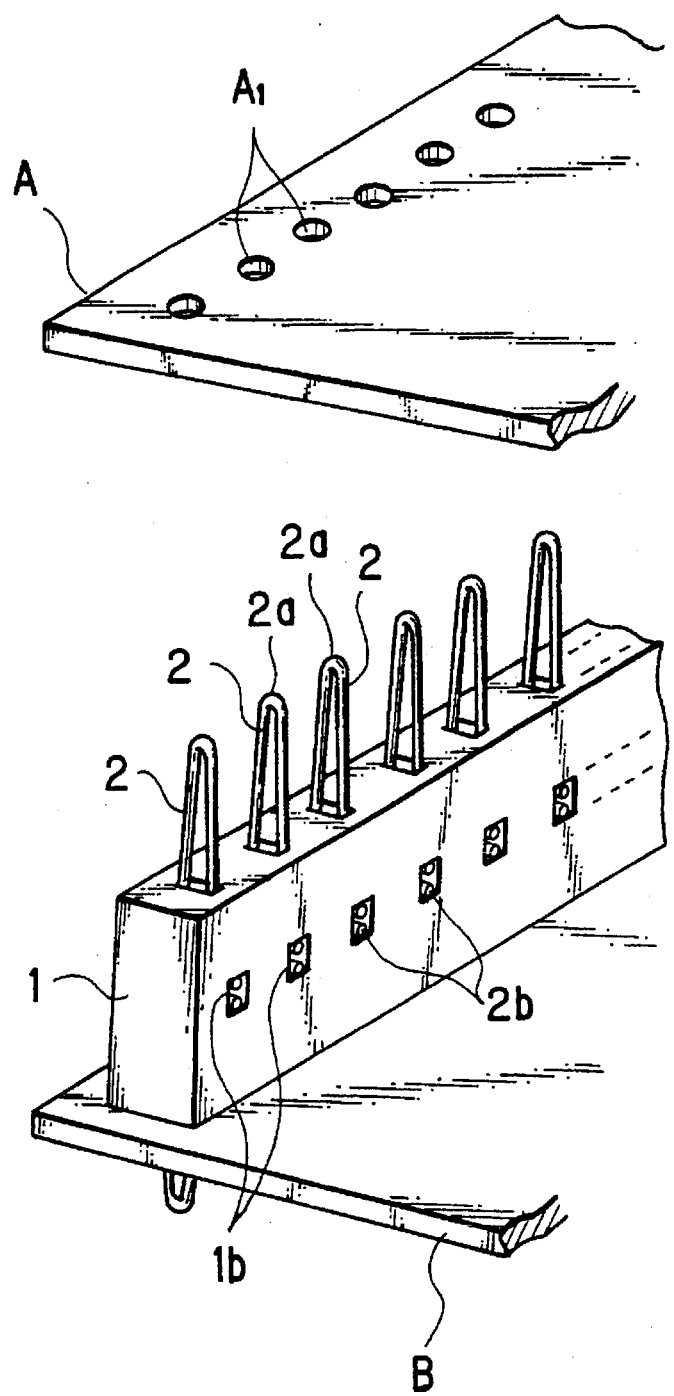
FIG.1 is a perspective view of the state in which two printed wiring boards are prepared to be connected by using one embodiment of the present invention.
Figure 2:
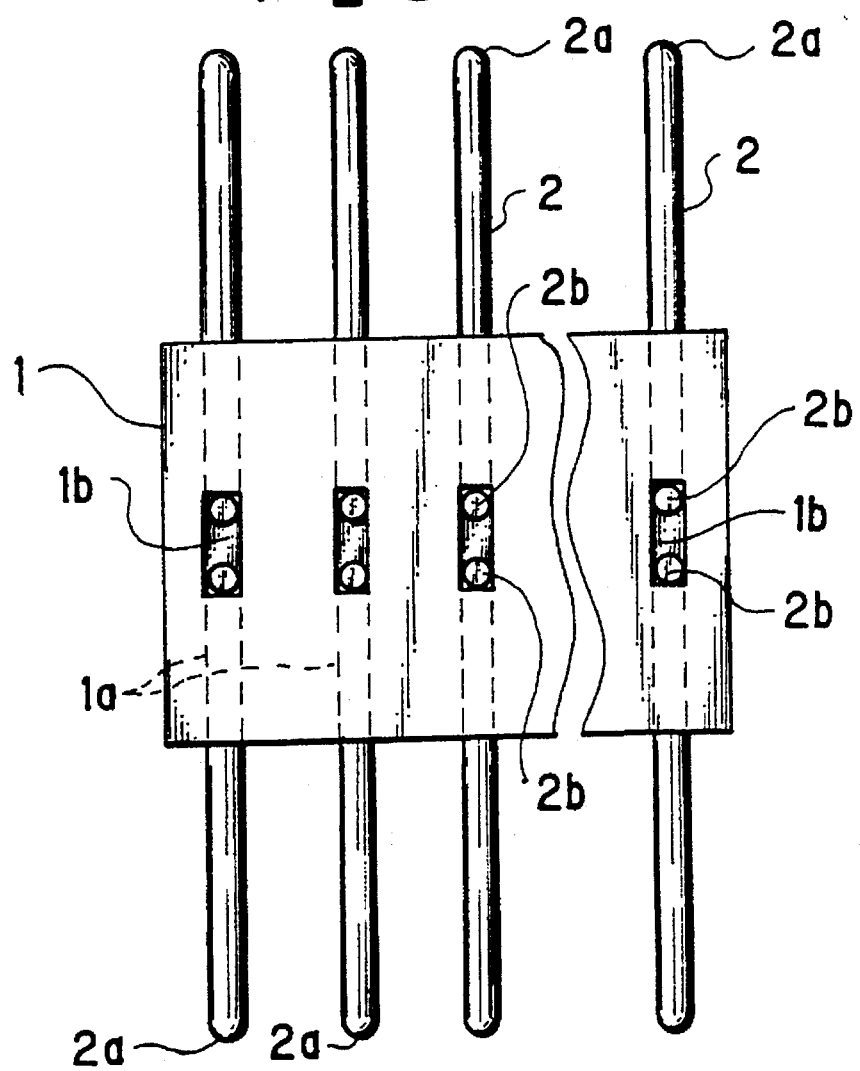
FIG. 2 is a front view of the printed wiring board connecting apparatus shown in FIG. 1.

Referring to FIG. 1 through FIG. 4, an elongated spacer 1 constructed of a synthetic resin insulation material is vertically bored with a plurality of elongated vertical pin support spaces 1a at a regular interval to open at both opposite ends. Said spacer 1 is also formed with a horizontal holes 1b extending substantially perpendicular to said pin support spaces 1a and in communication therewith from the substantially middle portion of each vertical pin support spaces 1a to open at a side face of the spacer 1.

The numeral 2 denotes connection pins each made of an elastic metal wire such as a copper wire and has bent portions 2a resiliently bent over in a hair pin configuration.

Further from the bent portions 2a of the pins toward the tips thereof, each connection pin 2 is again bent outwardly to form stop portions 2b in a coat hanger configuration.

Figure 3:
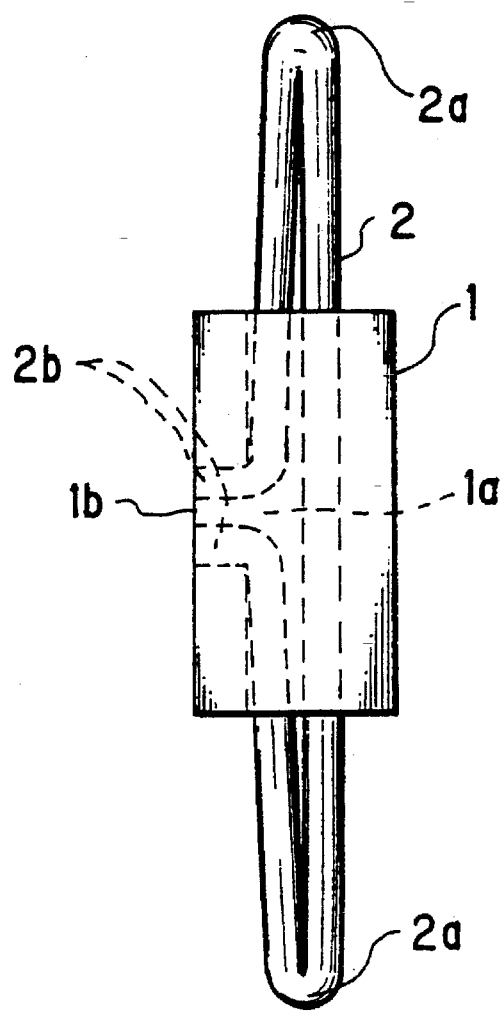
FIG. 3 is a side elevation of the printed wiring board connecting apparatus shown in FIG. 1.
Figure 4:
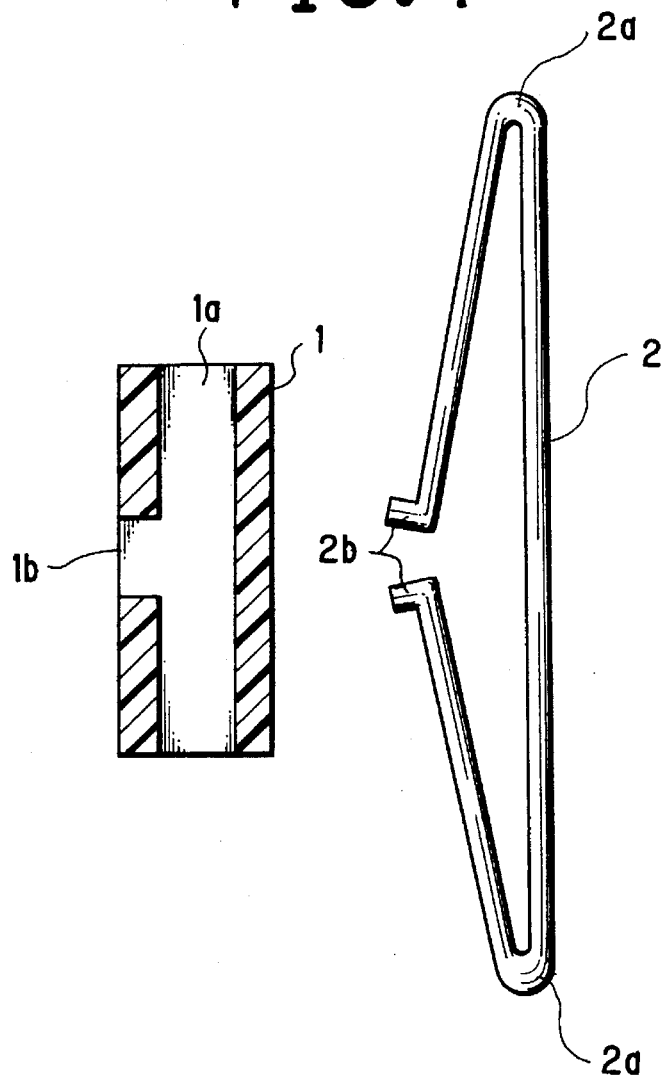
FIG. 4 is a side elevation partly in section of the disassembled printed wiring board connecting apparatus in FIG.1.

Stated in another way, each connection pin has first and second ends, in correspondence to which a first contact section on the first end side and a second contact section on the second end side are provided. As shown in FIG. 3, the first and second contact sections are bent over to form said Then, said connction pins 2 are inserted into the vertical pin support spaces 1a within the spacer 1 while said bent portions 2a of the connection pins 2 are compressed against the resiliency thereof. When the stoppers 2b are located at said horizontal pin engagement holes 1b, the force for said compression is removed such that the stoppers 2b of the bent portions 2a are inserted into the horizontal pin engagement hole 1b to secure the connection pin 2 within the spacer 1.

In order to connect the two printed wiring boards A and B shown in FIG.1 by using the printed wiring board connection apparatus of the present invention, one of the bent portions 2a on one side of the connection pins 2 are first inserted into a throughholes in the printed wiring board B such that the underside of the spacer 1 abuts against the upper surface of the printed wiring board B.

Figure 5:
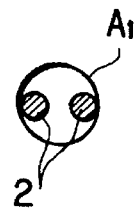
FIG. 5 is a plan view partly in section of the state in which the connection pins are inserted in the throughholes formed in one printed wiring board.
Figure 6:
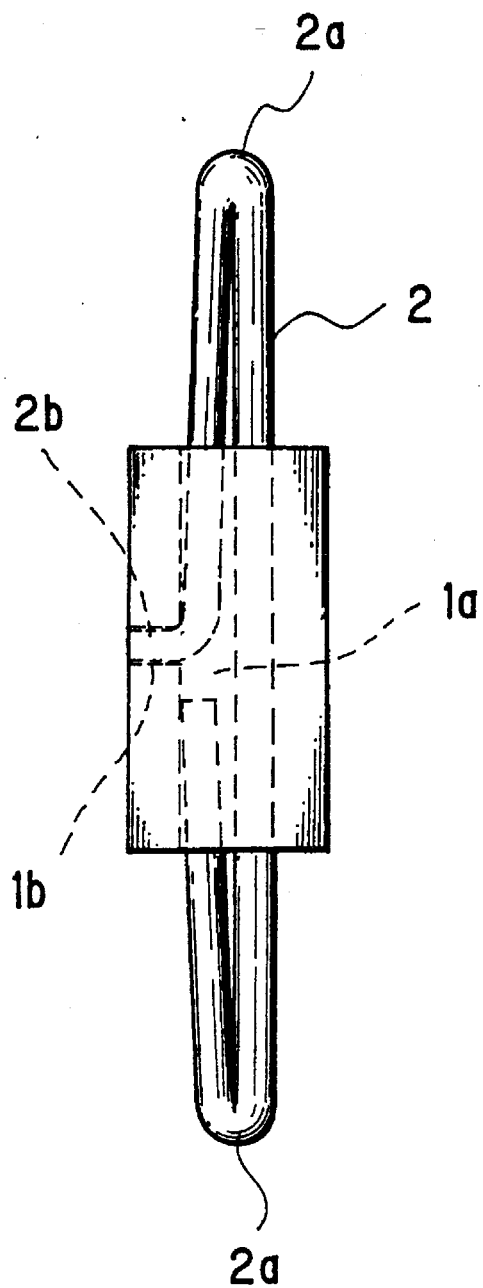

Then, the bent portions 2a on the other side of the connection pins 2 are inserted into throughholes A1 in the printed wiring board A until the underside of said printed wiring board A abuts against the top of the spacer 1. In this state, the connection pins 2 tend to extend due to its elasticity at the bent portion 2a such as to be pressed against the throughholes A1 in the printed wiring boards A and B as shown in FIG.5. In this way, electrical connections between the patterns on the two printed wiring boards are established.

In this connection, there is a need to give consideration to the length of the stopper 2b such that said stoppers 2b will not come off the horizontal pin engagement holes 1b while the pins 2 are being inserted into the through holes A1. However, the pins 2 are not required to be formed with stoppers at both ends thereof. In other words, a stopper 2b only at one end of each pin is sufficient for the pin 2 and the horizontal pin engagement hole 1b is only required to be sized to allow insertion of said single stopper 2b.

While the spacer 1 in the foregoing embodiment is shown in the form of an elongated one, any modification thereof is acceptable; that is, an independent one having a single pin support space therein or a proper number of ones having a desired number of pin support spaces and united into a continuous spacer.

Referring to FIG. 7 through FIG. 10, another emobodiment will be explained in which similar members are given similar numerals and characters.

An elongated spacer 1 constituted of synthetic resin insulation material is bored with elongated vertical pin support spaces 1a at a regular interval. At intermediate portion of each vertical pin support space 1a, a pin engagement hole 1b is formed to open forwardly while at the lowerest portion 1c on an opposite side to said pin engagement hole 1b of each vertical hole 1a is formed a groove 1c to provide communication rearwardly from said vertical space 1a.

The numeral 2 designates a first connection pin made of a length of elastic metal wire such as copper. Said connetion pin 2 is resiliently bent over to form a bent portion 2a in hair pin configuration and is further bent at one end portion thereof to form a bent stopper 2b extending outwardly and a straight vertical portion 2c extending from said bent portion 2a at the other end thereof.

In this embodiment, it is to be noted that said bent portion 2a constitutes a first contact section while the straight portion 2c constitute the second contact section.

Figure 9:
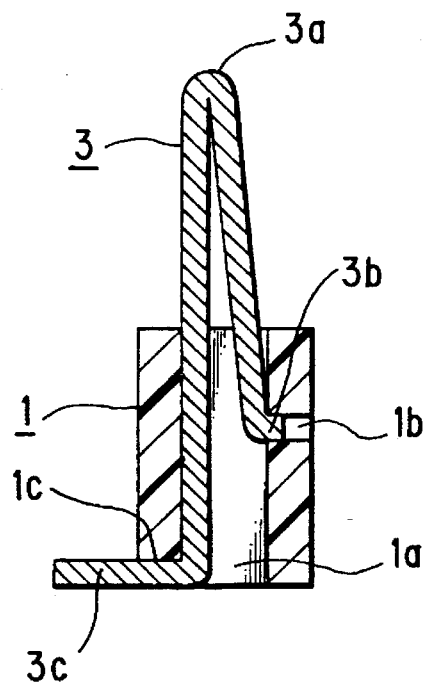
FIG. 9 is a sectional side view of the central portion of the printed wiring board connecting apparatus of FIG. 7.
Figure 10:
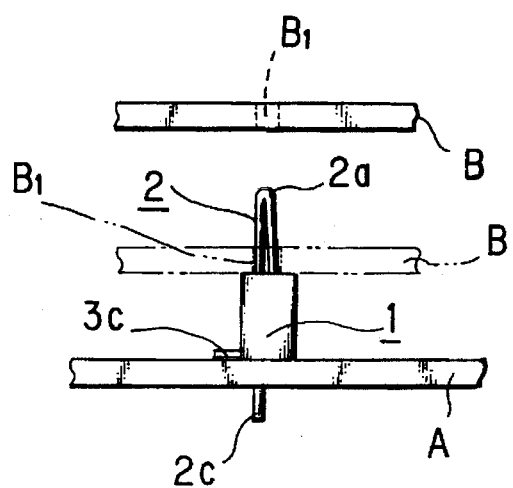
FIG. 10 is a side elevation of the embodiment of FIG. 7.

The numeral 3 in FIG. 9 designates a second connection pin fmade of a similar material to the first connection pin 2. Said connection pin 3 is resiliently bent over to form a bent portion 3a in hair pin configuration and are further bent at its one end portion to form a bent stopper 3b extending outwardly and a straight horizontal portion 3c bent from said bent portion 3a and extending rearwardly. In this embodiment, it is to be noted that said bent portion 3a constitutes a first contact section while the straight horizontal portion 3c constitutes a second contact section.

Figure 7:
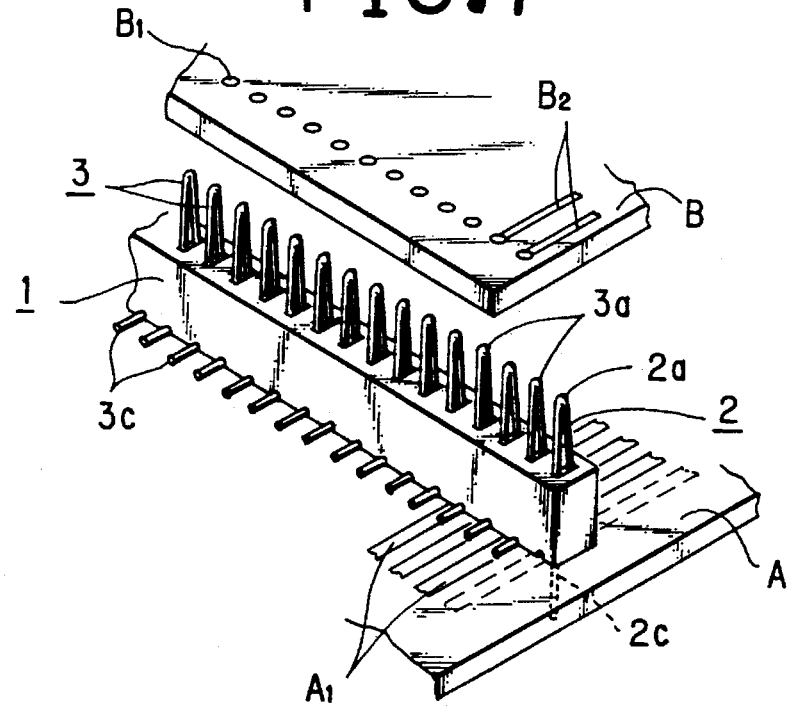
FIG. 7 is a perspective view of a further embodiment of the printed wiring board connecting apparatus in which the printed wiring boards are prepared to b connected.

Said first connection pin 2 as shown in FIG. 7 is pressed against the elasticity thereof and are inserted into the vertical pin support space 1a at the opposite lateral ends of the spacer 1 until the stopper 2b are located at the pin engagement holes 1b and the compression is removed. Then, each bent portion 2b is inserted into the pin engagement hole 1b by virtue of its elasticity such that each connection pin 2 is secured within the spacer 1 while the vertical portion 2c is caused to protruded downwardly from the vertical hole 1a.

Then, each bent portion 3a of the second connection pin 3 is inserted in a compressed state similar to the aforesaid way into another vertical pin support space 1a exclusive of said vertical pin support spaces 1a at opposite sides of the spacer 1 such that the relevant stopper 3b is inserted into the pin engagement hole 1b. In this state, the horizontal portion 3c is fitted into the groove 1c formed in the lower portion of the spacer 1.

Figure 8:
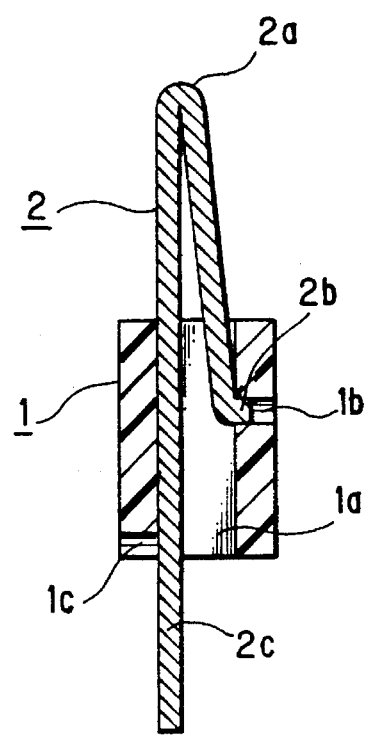
FIG. 8 is a side view of another embodiment of the printed wiring board connecting apparatus.

By using the thus structured printed wiring board connection apparatus according to the present invention, the two printed wiring boards A and B in FIG. 7 are connected first by inserting the vertical portion 2c of the first connection pin 2 shown in FIG. 8 into the throughholes formed in the printed wiring boards A before soldering said vertical portion 2c on the back surface thereof. Similarly, the horizontal portion 3c of the second connection pins 3 shown in FIG. 9 are soldered to the pattern A1 formed on the printed wiring board A.

Then, the bent portions 2a and 3a of the first and second connection pins 2 and 3 which are thus secured in said printed wiring board A protrude from the top opening of the spacer 1 such that the throughholes B1 in the printed wiring board B is brought closer to said bent portions 2a and 3a from above to insert said bent portions 2a and 3a thereinto until the back face of the printed wiring board B contacts the top side of the spacer 1. In this state, the bent portions 2a and 3a tend to expand by virtue of their elasticity so as to press against the throughholes B1 in the printed wiring board B. In this way, the patterns A1 and B1 on the two printed wiring boards A and B are electrically connected by means of the first and second connection pins 2 and 3.

Next, a further emobodiment of the present invention will be explained with reference to FIGS. 11 through 14.

The numeral 4 designates an elongated spacer made of synthetic resin insulation material and is bored with elongated horizontal pin support spaces 4a each extending laterally at a regular interval. At a substantially central portion of each horizontal pin support space 4a, a pin engagement hole 4b is formed to open upwardly while a groove 4c is formed rearwardly in the underside thereof to provide communication to said horizontal support space 4a.

The numeral 5 designates the first connection pin made of a length of elastic matal wire such as copper wire. Said connection pin 5 is resiliently bent at an intermediate portion thereof to form a bent portion 5a in hair pin configuration which works as a first contact section and is again bent at one end portion thereof to form stopper 5b to extend outwardly. Said connection pin 5 is further again bent at another end portion thereof to form a vertical portion 5c extending downwardly to work as a second contact section.

Figure 13:
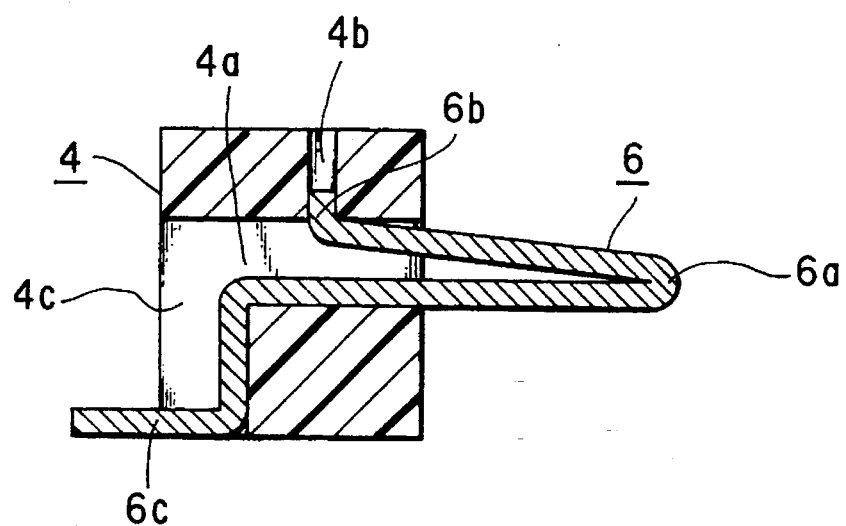
FIG. 13 is a vertical sectional side view of the central portion of the embodiment of FIG. 7.
Figure 14:
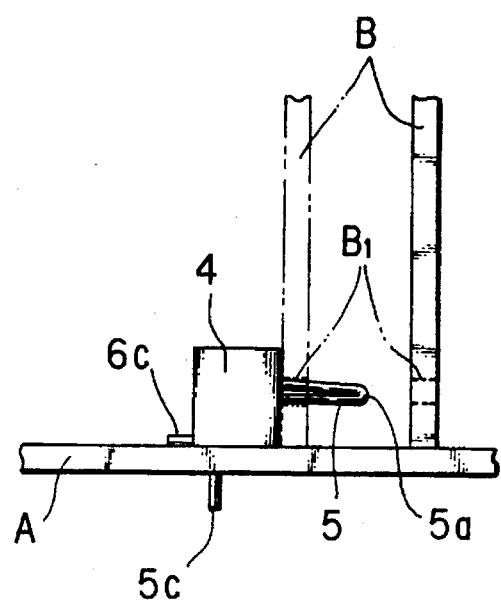
FIG. 14 is a side elevation of FIG. 11.

The numeral 8 in FIG. 13 designates a second connection pin made of a material similar to the first connection pin 5. Said conntion pin 6 resiliently bent at an intermediate portion thereof to form a bent portion 6a in hair pin configuration and is again bent at one end thereof to form a stopper 6b to extend forwardly. Said connection pin 6 is further again bent at one extension from the bent portion 6a to form a horizontal portion 6c in a Z letter configuration for the tip thereof to extend rearwardly.

And then, the bent portion 5a of said first connection pin 5 is compressed against the elasticity thereof. In this state, said pin is inserted into the horizontal pin support spaces 4a at each opposite end of the spacer 4 until the stopper 5b located at the pin engagement hole 4b, where the force for compression is removed. Then, as the stopper 5b is resiliently inserted into the engagement hole 4b, the first connection pin 5 is secured within the spacer 4. In this state, the vertical portion 5c protrudes downwardly from the groove 4c.

Next, the second connection pin 6 are inserted into other horizontal pin support spaces 4a excluding the holes at respective opposite ends of hte spacer 4 while the bent portions 6a are compressed as in an aforementioned manner. In this state, the horizontal portions 6c are fitted along the groove 4c formed in the underside of the spacer 4.

Figure 11:
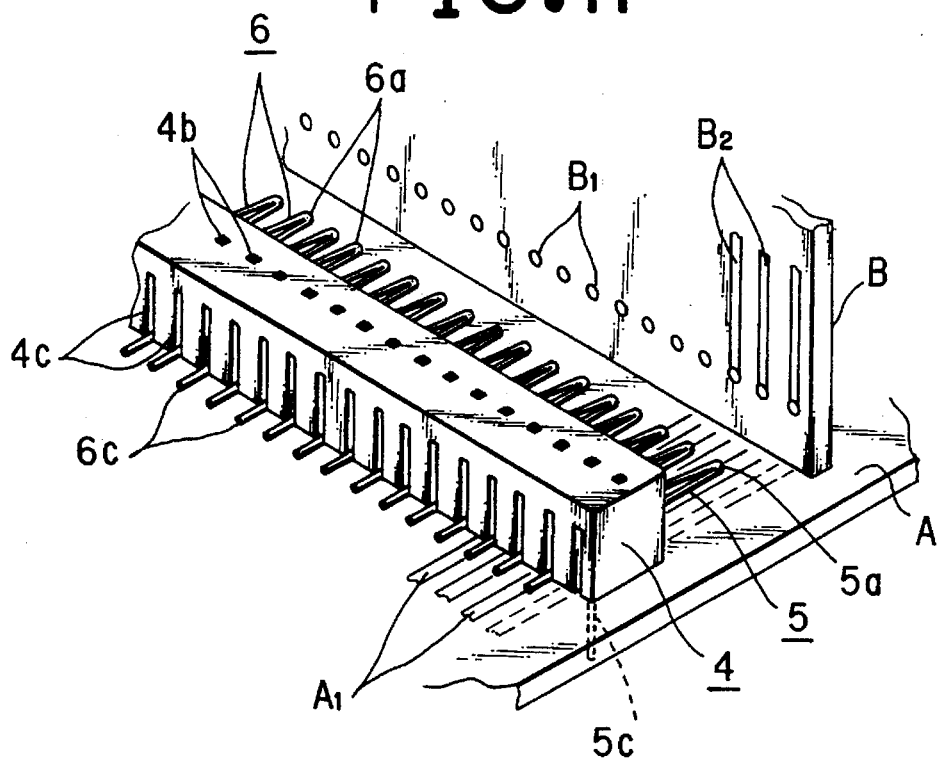
FIG. 11 is a perspective view of a still further embodiment of the present invention in which the printed wiring boards are prepared to be connected.
Figure 12:
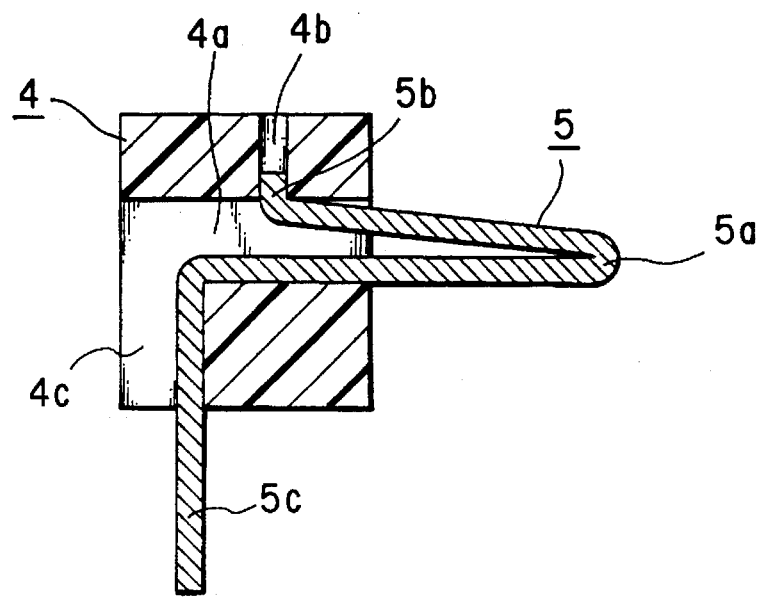
FIG. 12 is a vertical sectional side view of one of the opposite ends of the embodiment of FIG. 11.

By using the thus structured printed wiring board connection device according to the present invention, the two printed wiring board A and B in FIG. 11 are connected first by inserting the vertical portion 5c of the first connection pin 5 into the throughholes formed in the printed wiring board A before soldering said vertical portion 5c on the back surface thereof. Similarly, the horizontal portion 6c of the second connection pins 6 are soldered to the pattern A1 formed on the printed wiring board A.

Thus, the bent portions 5a and 6a of the first and second connection pins 2 and 3 which are thus secured in said printed wiring board A protrude from the front of the spacer 4 such that the throughholes B1 in the printed wiring board B are brought close to said bent portions 5a and 6a from ahead to insert said bent portions 5a and 6a thereinto until the back face of the printed wiring board B contacts the front face of the spacer 4. In this state, the bent portions 5a and 6a tend to expand by virtue of their elasticity so as to press against the throughholes B1 in the printed wiring board B. In this way, the patterns A1 and B1 on the two printed wiring boards A and B are electrically connected by means of the first and second connection pins 5 and 6.

Figure 15:
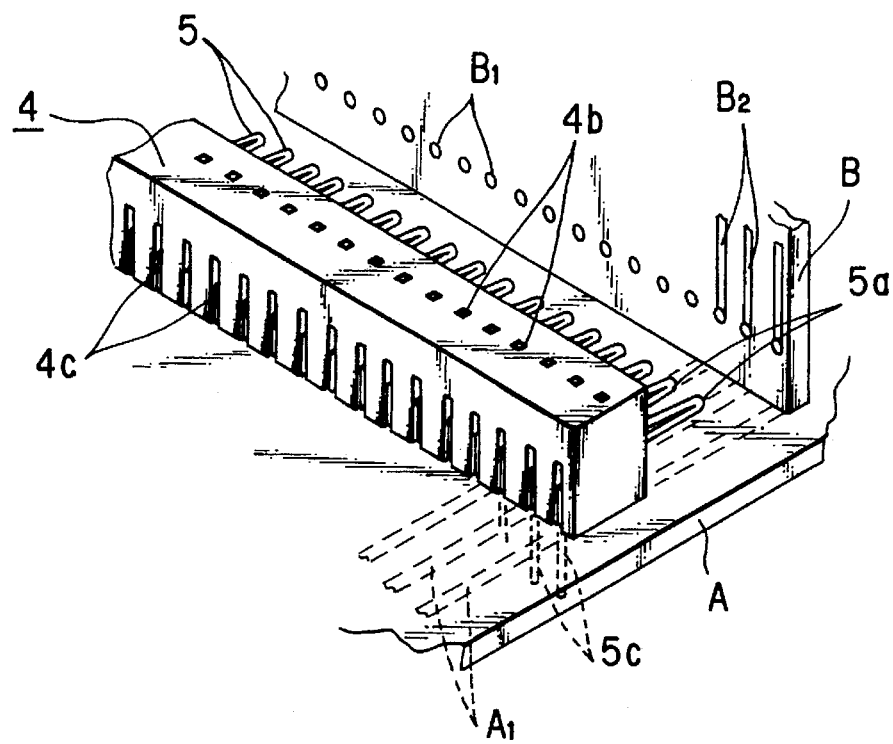
FIG. 15 is a perspective veiw of a still further embodiment of the present invention, in which the printed wiring boards are connected.
Figure 16:
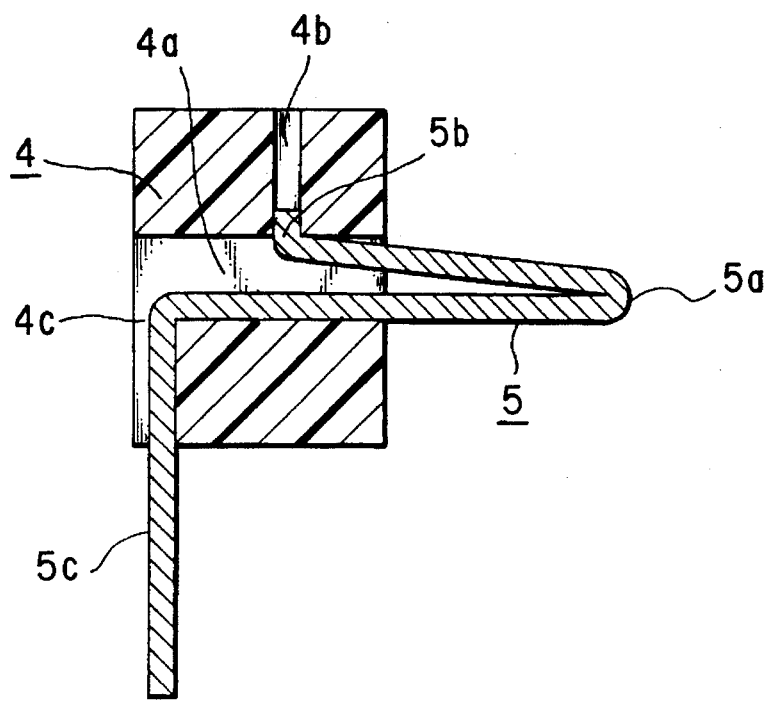
FIG. 16 is a vertical sectional view of FIG. 15.
Figure 17:
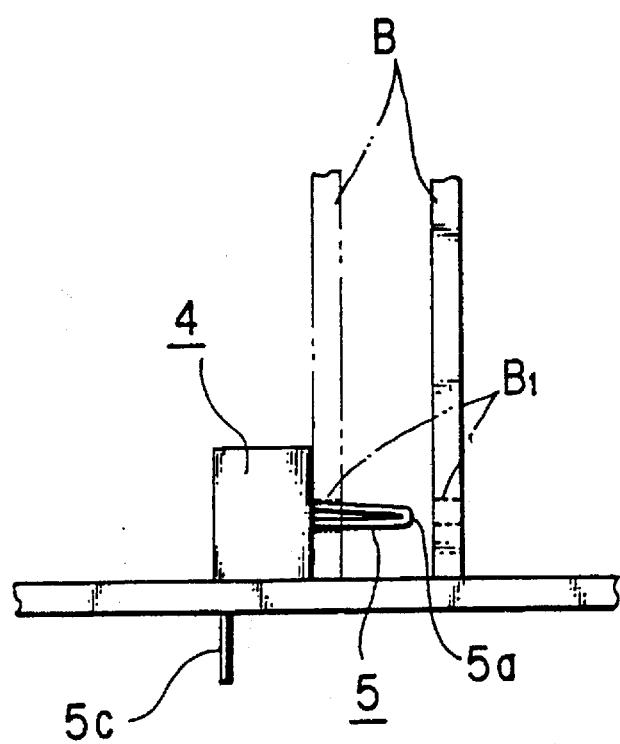
FIG. 17 is a side elevation of FIG. 15.
Figure 18:
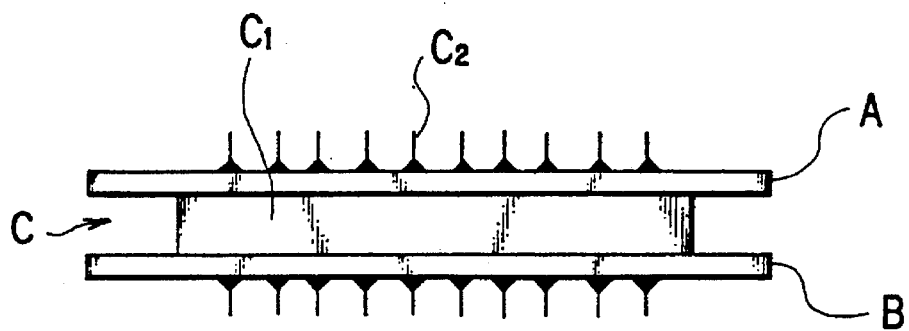
FIG. 18 is a side elevation of one prior art printed wiring board connecting apparatus in which two printed wiring boards are connected.
Figure 19:
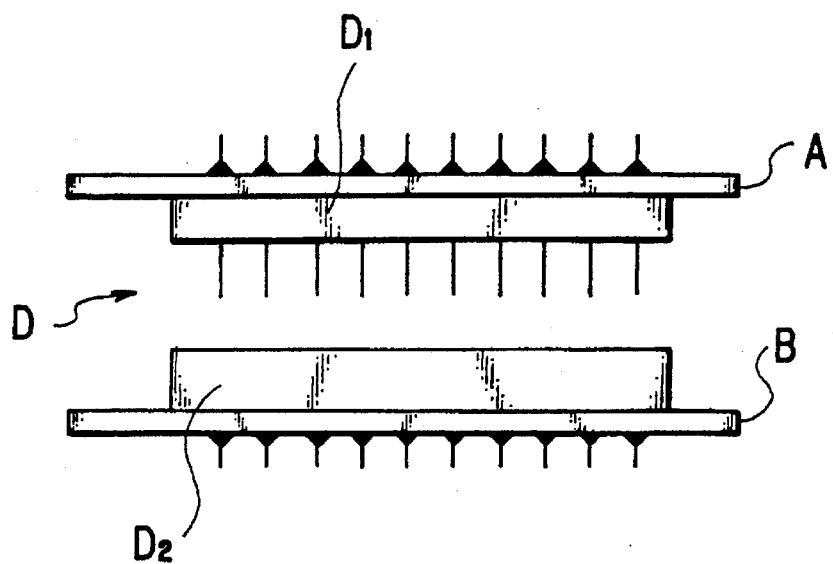
FIG. 19 is a side elevation of another prior art printed wiring board connecting appratus in which two printed wiring boards are connected.

Next, a still further embodiment of the present invention will be explained with reference to FIGS. 15 through The connection pins in this embodiment are similar to the first connection pins 5 in the second embodiment while the spacer 4 is formed with a shallower groove 4c. Then, the vertical portion 5c are inserted into the throughholes formed in the printed wiring board A to be soldered on the underside thereof.

Therefore, the printed wiring board B is connected to the printed wiring board A by taking the printed wiring board B vertically from above toward the printed wiring board A as in the third embodiment such that the bent portion 5a of the connection pin 5 are inserted into the throughhole B1 of the printed wiring board B. In this way, the patterns A1 and B1 on the two printed wiring board A and B are electrically connected by the connection pins 5.

In this connection, it is to be noted that a careful consideration is required to be given to the length of stoppers 2b, 3b, 5b and 6b such that said stoppers 2b, 3b, 5b and 8b will not come off the pin engagement holes 1b and 4b while the connections pins are being inserted into the throughholes B1 of the printed wiring board B. Also, although the spacers are shown in the elongated form in the foregoing embodiment, a single independent one or a plurallity of spacers provided in divided form in proper numbers may be used.

The present invention facilitates electrical connection of the patterns on the two printed wiring boards as explained in the foregoing, in which the vertical or horizontal portions of the connection pins protruding from the spacer is soldered to one printed wiring board before the the throughholes in another printed wiring board is taken from above or from sideways close to the bent portions of the connection pins protruding from the top or the side surface of the spacer such that said bent portions are inserted into the throughholes to assure the reliable connection of the connection pins to the throughholes by virtue of the resiliency of the bent portions. As a result, the two printed wiring boards are easily separated upon repair work of the printed wiring boards while assuring the vertical or horizontal wiring arrangement.

Further, the invention has an advantage that the pattern designing of the printed wiring board has increased its elasticity because the spacer may be integrally and continuosly constructed such that connection pins are inserted into the all or a required number of spacers for simultaneous connection to the desired patterns on the two printed wiring boards.

What is claimed is:

1. A printed wiring board connection apparatus comprising a spacer of synthetic resin material, said spacer having a pin support space bored therethrough and a pin engagement hole extending perpendicular to and in communication with said pin support space, said pin support space having two opposite openings; and a connection pin, said connection pin including a length of elastic metal wire with first and second ends and having a first contact section on a side of said elastic metal wire near said first end and a second contact section on a side of elastic metal wire near said second end, said first contact section being bent over into a hair pin configuration to form a first resilient bent portion, said first end being bent outwardly perpendicular to said first contact section to form a first stopper, said connection pin being inserted into said pin support space with said stopper being inserted into said pin engagement hole such that said connection pin is resiliently secured within said spacer with said first and second contact sections protruding out from the pin support space at said two opposite openings thereof, wherein said second contact section is bent over into a hair pin configuration to form a second resilient bent portion, said second end being bent outwardly perpendicular to said second contact section to form a second stopper, and said second stopper being inserted into said pin engagement hole.

2. The printed wiring board connection apparatus according to claim 1, wherein said second contact section is bent over into a hair pin configuration to form a second resilient bent portion, said second end being maintained straight to terminate prior to said pin engagement hole.

3. The printed wiring board connection apparatus according to claim 1, wherein said pin engagement hole is formed to open in a side face of said spacer.

4. The printed wiring board connection apparatus according to claim 3, wherein said second contact section is maintained straight to extend within said pin support space.

5. The printed wiring board connection apparatus according to claim 1, wherein said spacer is formed with a groove on an opposite side of said pin support space to said pin engagement hole, said groove communicating with said pin support space such that said pin support space is adapted to open outwardly in a first direction perpendicular to said first contact section of said connection pin secured therewithin and in a second direction perpendicular to said first direction.

6. The printed wiring board connection apparatus according to claim 5, wherein said second contact section is bent and protrudes out of said spacer into said first direction.

7. A The printed wiring board connection apparatus according to claim 6, wherein said second contact section is bent first into said first direction and then into said second direction to protrude out of said spacer in said second direction.

8. A printed wiring board connection apparatus comprising a spacer of synthetic resin material, said spacer having a plurality of parallel pin support spaces bored therethrough and pin engagement holes respectively extending perpendicular to and in communication with said respective pin support spaces, each pin support space having two opposite openings; and at least one connection pin, said at least one connection pin including a length of elastic metal wire with first and second ends and having a first contact section on a side of said elastic metal wire near said first end and a second contact section on a side of said elastic metal near said second end, said first contact section being bent over into a hair pin configuration to form a first resilient bent portion, said first end being bent outwardly perpendicular to said first contact section to form a first stopper, said connection pin being inserted into a selected one of said pin support spaces with said first stopper being inserted into an appropriate engagement hole such that said at least one connection pin is resiliently secured within said spacer with said first and second contact sections protruding from said pin support spaces at said opposite openings thereof, wherein said second contact section is bent over into a hair pin configuration to form a second resilient bent portion, said second end being bent outwardly perpendicular to said second contact section to form a second stopper, and said second stopper being inserted into said pin engagement hole.

9. A printed wiring board connection apparatus comprising;
   a spacer of synthetic resin material having a first vertical surface and a second vertical surface in parallel with said first vertical surface, said spacer having first and second elongated pin support spaces vertically bored therethrough and pin engagement holes respectively extending from said first vertical surface in communication with said respective elongated pin support spaces, said spacer being formed at a lower portion thereof with grooves extending from said second vertical surface in communication with said respective elongated pin support spaces;
   first connection pins of elastic metal wire, said first connection pins having bent-over contact sections formed in a hair-pin configuration and straight contact sections, said first connection pins being inserted into said first elongated pin support spaces to be resiliently secured therewithin, said respective bent-over contact sections of said first connection pins each having free ends outwardly bent to form first stoppers, said respective first stoppers being engaged in an appropriate pin engagement hole, said bent-over contact sections protruding upwardly from said spacer, said straight contact sections protruding downwardly from said spacer; and
   second connection pins of elastic metal wire, said second connection pins having bent-over contact sections formed in a hair-pin configuration and horizontally bent contact sections, said second connection pins being inserted into said second elongated pin support spaces to be resiliently secured therewithin, said respective bent-over contact sections of said second connection pins having free ends bent to form second stoppers, said respective second stoppers being engaged in said appropriate pin engagement hole and said bent-over contact sections protruding rearwardly through said groove.

10. The printed wiring board connection apparatus according to claim 9, wherein said first elongated pin support spaces are formed at opposite lateral ends of said spacer, said elongated pin support spaces being formed therebetween.

11. A printed wiring board connection apparatus comprising;
   a spacer of synthetic resin material having a top surface and a bottom surface in parallel to said top surface, said spacer having first and second pin support spaces horizontally bored therethrough and pin engagement holes respectively extending from said top surface in communication with said respective elongated pin support spaces, said spacer being formed at a lower portion thereof with a groove extending from said bottom surface in communication with said respective elongated pin support spaces;
   first connection pins of elastic metal wire, said first connection pins having bent-over contact sections formed in a hair pin configuration and vertically bent contact sections, said first connection pins being inserted into said first pin support spaces to be resiliently secured therewithin, said respective bent-over contact sections of said first connection pins having free ends upwardly bent to form first stoppers, said respective first stoppers being engaged in said relevant pin engagement holes, said bent-over contact sections protruding horizontally from said spacer, said vertically bent contact sections protruding downwardly from said spacer; and
   second connection pins of elastic metal wire, said second connection pins having bent-over contact sections formed in a hair pin configuration and horizontally extending contact sections formed by being first bent downwardly and then horizontally, said second connection pins being inserted into said second elongated pin support spaces to be resiliently secured therewithin, said respective bent-over contact sections of said second connection pins having free ends bent to form second stoppers, said respective second stoppers being engaged in an appropriate pin engagement hole, said bent-over contact sections protruding from said spacer forwardly, and said horizontally bent contact sections protruding from said spacer through said groove rearwardly.

12. The printed wiring board connection apparatus according to claim 11, wherein said first elongated pin support spaces are formed at opposite lateral ends of said spacer, said second elongated pin support holes being formed therebetween.

13. A printed wiring board connection apparatus comprising;

a spacer of synthetic resin material having a top surface and a bottom surface in parallel with said top surface, said spacer having pin support spaces horizontally bored therethrough and pin engagement holes respectively extending from said top surface in communication with said respective elongated pin support spaces, and said spaces having grooves formed in said bottom surface, which said grooves open rearwardly; and connection pins of elastic metal wire, said connection pins having bent-over contact sections formed in a hair pin configuration and vertically bent contact sections, said connections pins being inserted into said pin support spaces to be resiliently secured therewithin, said respective bent-over contact sections having free ends bent to form stoppers, said stoppers being engaged in an appropriate pin engagement hole, said bent-over contact sections protruding from said stopper forwardly, said vertically bent contact sections protruding from said spacer through said respective grooves downwardly.

* * * * *